United States Patent
Yang et al.

(10) Patent No.: US 7,799,638 B2
(45) Date of Patent: Sep. 21, 2010

(54) METHOD FOR FORMING A MEMORY ARRAY

(75) Inventors: I-Chen Yang, Hsinchu (TW); Yao-Wen Chang, Hsinchu (TW); Tao-Cheng Lu, Hsinchu (TW)

(73) Assignee: MACRONIX International Co., Ltd, Hsinchu (TW)

( * ) Notice: Subject to any disclaimer, the term of this patent is extended or adjusted under 35 U.S.C. 154(b) by 138 days.

(21) Appl. No.: 12/263,091

(22) Filed: Oct. 31, 2008

(65) Prior Publication Data

US 2010/0112797 A1 May 6, 2010

(51) Int. Cl.
*H01L 21/00* (2006.01)
(52) U.S. Cl. ............... 438/261; 438/954; 257/E21.179
(58) Field of Classification Search ......... 438/257–267, 438/954; 257/E21.179
See application file for complete search history.

(56) References Cited

U.S. PATENT DOCUMENTS

| 5,998,287 | A | 12/1999 | Huang |
| 7,005,349 | B2* | 2/2006 | Lee et al. ............ 438/261 |
| 7,029,974 | B2 | 4/2006 | Jeon et al. |
| 7,037,781 | B2* | 5/2006 | Choi et al. ............ 438/257 |
| 2003/0075778 | A1 | 4/2003 | Klersy |
| 2007/0243680 | A1 | 10/2007 | Harari et al. |

FOREIGN PATENT DOCUMENTS

TW  527725  4/2003

* cited by examiner

*Primary Examiner*—Richard A. Booth
(74) *Attorney, Agent, or Firm*—J.C. Patents

(57) ABSTRACT

The invention is directed to a method for forming a memory array. The method comprises steps of providing a substrate having a charge trapping structure formed thereon. A patterned material layer is formed over the substrate and the patterned material layer having a plurality of trenches expose a portion of the charge trapping structure. Furthermore, a plurality of conductive spacers are formed on the sidewalls of the trenches of the patterned material layer respectively and a portion of the charge trapping structure at the bottom of the trenches is exposed by the conductive spacers. An insulating layer is formed over the substrate to fill up the trenches of the patterned material layer. Moreover, a planarization process is performed to remove a portion of the insulating layer until a top surface of the patterned material layer and a top surface of each of the conductive spacers are exposed.

35 Claims, 3 Drawing Sheets

METHOD FOR FORMING A MEMORY ARRAY

BACKGROUND OF THE INVENTION

1. Field of Invention

The present invention relates to a method for forming a semiconductor device. More particularly, the present invention relates to a method for forming a memory array.

2. Description of Related Art

Electrically programmable and erasable non-volatile memory technologies known as EEPROM and flash memory based on charge storage are used in a variety of modern applications. A number of memory cell structures are used for EEPROM and flash memory. As the dimensions of integrated circuits shrink, greater interest is arising in memory cell structures based on charge trapping dielectric layers, because of the scalability and simplicity of the manufacturing processes. Memory cell structures based on charge trapping dielectric layers include structures known by the industry names NROM, SONOS, MONOS, TANOS and PHINES, for example. These memory cell structures store data by trapping charge in a charge trapping dielectric layer, such as silicon nitride.

Conventionally, after the charge trapping dielectric layer is formed over the substrate, the word lines are formed by forming a conductive layer over the substrate and then patterning the conductive layer into the word lines. By using the method for forming the word lines mentioned above, it is difficult to further scale down the size of each of the word lines since the size of the word line is limiter by the resolution of the optical tool used in the photolithography process. Therefore, the size of a memory unit is limited by the capability of the photolithography process.

SUMMARY OF THE INVENTION

Accordingly, the present invention is to provide a method for forming a memory array having word lines with sizes smaller than the minimum size limited by the photolithography technology.

To achieve these and other advantages and in accordance with the purpose of the invention, as embodied and broadly described herein, the invention provides a method for forming a memory array. The method comprises steps of providing a substrate having a charge trapping structure formed thereon and a plurality bit lines formed therein. A patterned material layer is formed over the substrate and the patterned material layer having a plurality of trenches expose a portion of the charge trapping structure. Furthermore, a plurality of conductive spacers are formed on the sidewalls of the trenches of the patterned material layer respectively and a portion of the charge trapping structure at the bottom of the trenches is exposed by the conductive spacers. An insulating layer is formed over the substrate to fill up the trenches of the patterned material layer. Moreover, a planarization process such as CMP or etching back process is performed to remove a portion of the insulating layer until a top surface of the patterned material layer and a top surface of each of the conductive spacers are exposed.

According to one embodiment of the present invention, the width of the conductive spacer is smaller than 200 angstroms.

According to one embodiment of the present invention, the pitch of the conductive spacer is smaller than 500 angstroms.

According to one embodiment of the present invention, the thickness of the patterned material layer is about 800~1000 angstroms.

According to one embodiment of the present invention, the step of forming the conductive spacer further comprises steps of forming a conductive material layer over the substrate, wherein the conductive material layer is conformal to the trenches. A portion of the conductive material layer is removed until a top surface of the patterned material layer and a portion of the charge trapping structure at bottom of the trenches are exposed.

According to one embodiment of the present invention, the charge trapping structure comprises, from a bottom to a top of the charge trapping structure, a bottom material layer, a carrier storage layer and an upper material layer.

According to one embodiment of the present invention, the bottom material layer comprises a single-layered material layer made of low-k (low-dielectric constant) material.

According to one embodiment of the present invention, the bottom material layer comprises a single-layered material layer made of high-k (high-dielectric constant) material.

According to one embodiment of the present invention, the bottom material layer comprises a multi-layered material layer.

According to one embodiment of the present invention, the multi-layered material layer can be selected from a group consisting of a low-k/high-k layer and a low-k/high-k/low-k layer.

According to one embodiment of the present invention, the material of the carrier storage layer comprises silicon nitride and silicon-rich nitride.

According to one embodiment of the present invention, the upper material layer comprises a single-layered material layer made of low-k (low-dielectric constant) material.

According to one embodiment of the present invention, the upper material layer comprises a single-layered material layer made of high-k (high-dielectric constant) material.

According to one embodiment of the present invention, the upper material layer comprises a multi-layered material layer.

According to one embodiment of the present invention, the material of the conductive spacers is selected from a group consisting of polysilicon, doped polysilicon, tungsten, aluminum, titanium, titanium nitride, tantalum nitride, copper, iridium oxide, platinum, nickel and the combination thereof.

According to one embodiment of the present invention, after the planarization process is performed, the conductive spacers are transformed to be a plurality word lines.

According to one embodiment of the present invention, the conductive spacers are parallel to each other and across the buried bit lines within the substrate.

The present invention provides another method for forming a memory array. The method comprises steps of providing a substrate having a charge trapping structure formed thereon. A plurality of strip-type patterns are formed over the substrate, wherein the strip-type patterns are parallel to each other and the strip-type patterns are separated from each other by a plurality of gaps respectively. A conductive spacers is formed on each sidewall of the patterns respectively and a portion of the charge trapping structure between the strip-type patterns is exposed. Furthermore, an insulating layer is formed over the substrate to fill up the gaps between the strip-type patterns. A planarization process is performed to remove a portion of the insulating layer until a top surface of the patterns and a top surface of each of the conductive spacers are exposed.

According to one embodiment of the present invention, a distance between the strip-type patterns is larger than a width of each of the strip-type patterns.

According to one embodiment of the present invention, the width of the conductive spacer is smaller than 200 angstroms.

According to one embodiment of the present invention, the pitch of the conductive spacer is smaller than 500 angstroms.

According to one embodiment of the present invention, the height of each of the patterns is about 800~1000 angstroms.

According to one embodiment of the present invention, the step of forming the conductive spacer further comprises steps of forming a conductive material layer over the substrate and the conductive material layer is conformal to the patterns. A portion of the conductive material layer is removed until a top surface of each of the patterns and a portion of the charge trapping structure between the patterns are exposed.

According to one embodiment of the present invention, the charge trapping structure comprises, from a bottom to a top of the charge trapping structure, a bottom material layer, a carrier storage layer and an upper material layer.

According to one embodiment of the present invention, the bottom material layer comprises a single-layered material layer made of low-k (low-dielectric constant) material.

According to one embodiment of the present invention, the bottom material layer comprises a single-layered material layer made of high-k (high-dielectric constant) material.

According to one embodiment of the present invention, the bottom material layer comprises a multi-layered material layer.

According to one embodiment of the present invention, the multi-layered material layer can be selected from a group consisting of a low-k/high-k layer and a low-k/high-k/low-k layer.

According to one embodiment of the present invention, the material of the carrier storage layer comprises silicon nitride and silicon-rich nitride.

According to one embodiment of the present invention, the upper material layer comprises a single-layered material layer made of low-k (low-dielectric constant) material.

According to one embodiment of the present invention, the upper material layer comprises a single-layered material layer made of high-k (high-dielectric constant) material.

According to one embodiment of the present invention, the upper material layer comprises a multi-layered material layer.

According to one embodiment of the present invention, the material of the conductive spacers is selected from a group consisting of polysilicon, doped polysilicon, tungsten, aluminum, titanium, titanium nitride, tantalum nitride, copper, iridium oxide, platinum, nickel and the combination thereof.

According to one embodiment of the present invention, the conductive spacers are parallel to each other.

According to one embodiment of the present invention, after the planarization process is performed, the conductive spacers are transformed to be a plurality word lines.

In the present invention, the conductive spacers in the later formed memory array are functioned as word lines. Since the conductive spacers are formed as spacers on the sidewalls of the patterned material layer, the width of each of the word lines can be well controlled and can be further scaled down to the size smaller than the minimum size limited by the photolithography process. Thus, the memory unit with the conductive spacers as the word lines is smaller than the conventional memory unit. Further, by controlling the thickness of the patterned material layer and the thickness of the conductive material layer, the width of each of the word lines can be easily controlled.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
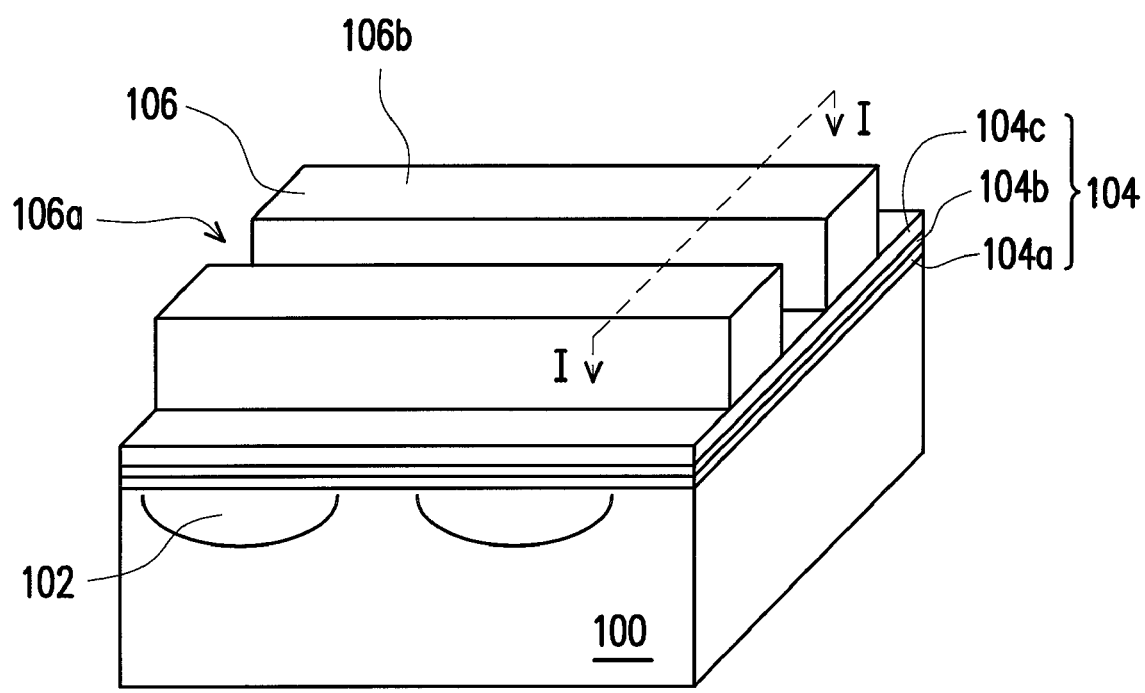
FIG. 1 is a three-dimension diagram schematically showing a substrate for forming a memory array thereon according to one embodiment of the invention.
Figure 2A:
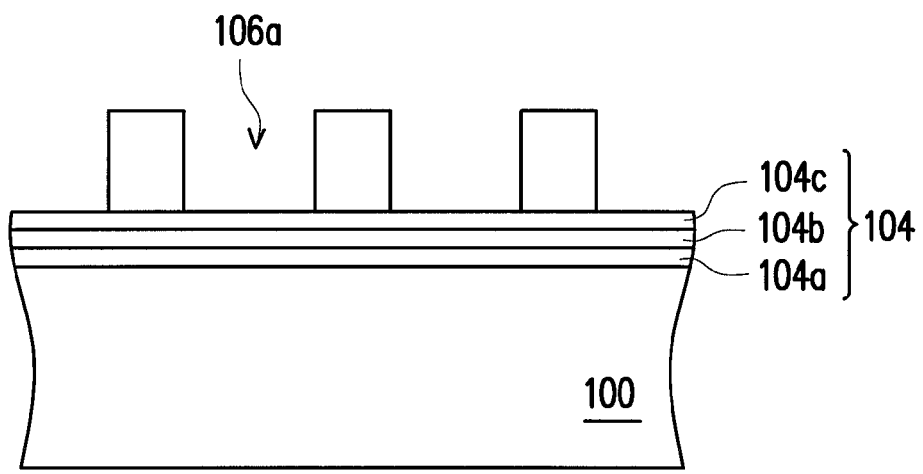
FIGS. 2A through 2E are cross-sectional views along the line I-I in FIG. 1 for showing a method for forming a memory array according to one embodiment of the present invention.

FIG. 1 is a three-dimension diagram schematically showing a substrate for forming a memory array thereon according to one embodiment of the invention. FIGS. 2A through 2E are cross-sectional views along the line I-I in FIG. 1 for showing a method for forming a memory array according to one embodiment of the present invention. As shown in FIG. 1 and FIG. 2A, a substrate 100 having several buried bit line regions 102 formed therein is provided. The substrate 100 can be, for example but not limited to, a silicon substrate or a silicon-on-insulator substrate. Furthermore, the conductive type of each of the buried bit line regions 102 can be, for example but not limited to, N type or P type. Then, as shown in FIG. 1 and FIG. 2A, a charge trapping structure 104 is formed over the substrate 100. It should be noticed that, the charge trapping structure comprises, from the bottom to the top of the charge trapping structure, a bottom material layer 104a, a carrier storage layer 104b and an upper material layer 104c. The bottom material layer 104a can be, for example but not limited to, a single-layered material layer made of low-k (low-dielectric constant) material. The low-k material can be, for example but not limited to, silicon oxide. Also, the bottom material layer 104a can be, for example but not limited to, a single-layered material layer made of high-k (high-dielectric constant) material. The high-k material can be, for example but not limited to, hafnium aluminum oxide (HfAlO). In one embodiment, the bottom material layer 104a, can be for example but not limited to, a multi-layered material layer. The multi-layered material layer can be selected from a group consisting of a low-k/high-k layer and a low-k/high-k/low-k layer and any combination of low k and high k layer. Furthermore, low-k/high-k layer can be, for example but not limited to, the silicon oxide/HfSiO layer, the silicon oxide/HfO2 layer or the oxide/nitride layer. Moreover, the low-k/high-k/low-k layer can be, for example but not limited to, the silicon oxide/silicon nitride/silicon oxide layer or silicon oxide/aluminum oxide/silicon oxide layer. In addition, the material of the carrier storage layer 104b can be, for example but not limited to, silicon nitride and silicon-rich nitride. Further, the upper material layer 104c can be, for example but not limited to, a single-layered material layer made of low-k material, high-k material, silicon oxide, HfAlO or aluminum oxide. Also, in another embodiment, the upper material layer 104c can be, for example but not limited to, a multi-layered material layer such as the silicon nitride/silicon oxide or silicon oxide/silicon nitride/silicon oxide. Furthermore, in the other embodiment, the multi-layered material layer can be selected from a group consisting of a low-k/high-k layer and a low-k/high-k/low-k layer and any combination of low k and high k layer.

Thereafter, as shown in FIG. 1 and FIG. 2A, a patterned material layer 106 is formed over the substrate 100. The patterned material layer 106 having a plurality of trenches 106a expose a portion of the charge trapping structure 104. The patterned material layer 106 can be, for example but not limited to, made of silicon nitride, silicon oxide or silicon oxy-nitride. Besides, the thickness of the patterned material layer 106 is about 800~1000 angstroms. In one embodiment, the patterned material layer 106 is constructed by a plurality of strip-type patterns 106b. That is, the strip-type patterns 106b are formed on the charge trapping structure 104 and are the parallel to each other. Moreover, the strip-type patterns 106b are separated from each other by a plurality of gaps 106a (also known as trenches 106a mentioned above) respectively. In addition, a distance between the strip-type patterns 106b is larger than a width of each of the strip-type patterns 106b.

Figure 2B:
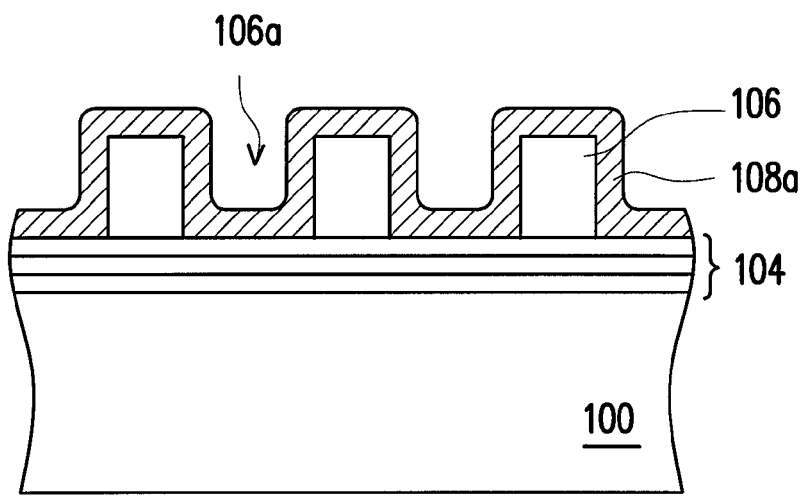
Figure 2C:
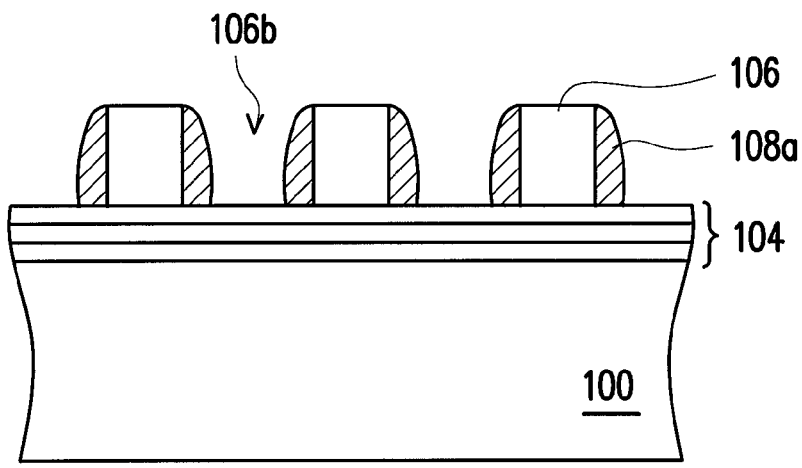

Then, as shown in FIG. 2B, a conductive material layer 108 is formed over the substrate 100. The conductive material layer 108 is conformal to the trenches 106a. The material of the conductive material layer 108 can be, for example but not limited to, selected from a group consisting of polysilicon, doped polysilicon, tungsten, aluminum, titanium, titanium nitride, tantalum nitride, copper, iridium oxide, platinum, nickel and the combination thereof. Then, as shown in FIG. 2C, a portion of the conductive material layer 108 is removed until a top surface of the patterned material layer 106 and a portion of the charge trapping structure 104 at the bottom of the trenches 106a are exposed. Therefore, the conductive material layer 108 is transformed into a plurality of conductive spacers 108a located on the sidewalls of the trenches 106a of the patterned material layer 106 respectively and a portion of the charge trapping structure 104 at the bottom of the trenches 106a is exposed by the conductive spacers 108a. It should be noticed that the width of each of the conductive spacers 108a is smaller than 200 angstroms. Also, the pitch of the conductive spacer 108a is smaller than 500 angstroms. Furthermore, the conductive spacers 108a are parallel to each other and across the buried bit lines 102 within the substrate 100.

Figure 2D:
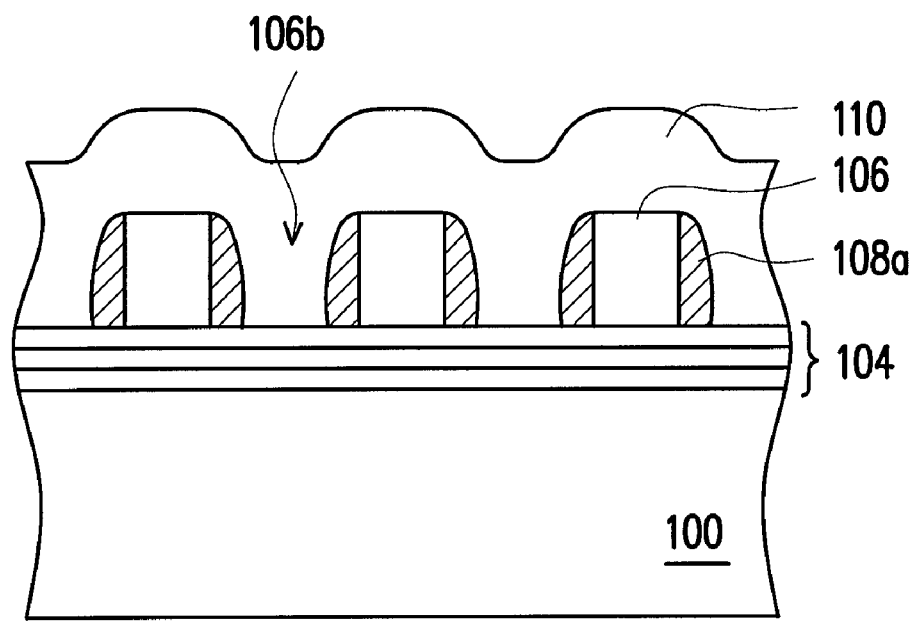
Figure 2E:
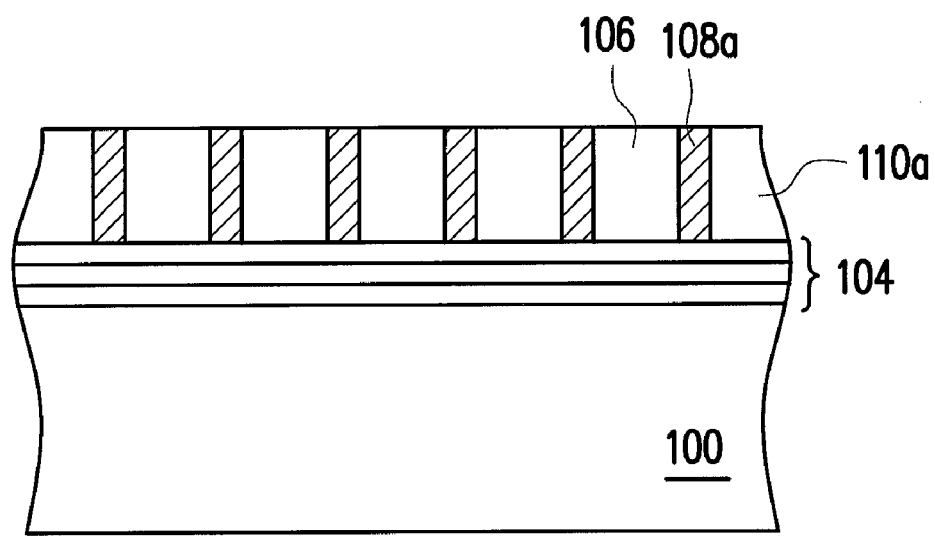

Then, as shown in FIG. 2D, an insulating layer 110 is formed over the substrate 100 to fill up the trenches 106a of the patterned material layer 106. The insulating layer 110 can be, for example but not limited to, silicon oxide, silicon nitride or silicon oxy-nitride. Moreover, as shown in FIG. 2E, a planarization process is performed to remove a portion of the insulating layer 110 until a top surface of the patterned material layer 106 and a top surface of each of the conductive spacers 108a are exposed. The planarization process can be, for example but not limited to, Chemical Polishing process or etching back process. Further, the planarization process further comprises an over polishing process or an over etching process so that the top surfaces of the conductive spacers 108a, patterned material layer 106 and the remaining insulating layer 110a are at the same level (As shown in FIG. 2E).

In the present invention, the conductive spacers in the later formed memory array are functioned as word lines. Since the conductive spacers are formed as spacers on the sidewalls of the patterned material layer, the width of each of the word lines can be well controlled and can be further scaled down to the size smaller than the minimum size limited by the photolithography process. By controlling the thickness of the patterned material layer and the thickness of the conductive material layer, the width of each of the word lines can be easily controlled. Comparing with the conventional method for shrinking the size of the word lines by directly defining the conductive layer, the method of the present invention can provide smaller size of word lines. Thus, the memory unit with the conductive spacers as the word lines is smaller than the conventional memory unit.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for forming a memory array, comprising:
   providing a substrate having a charge trapping structure formed thereon;
   forming a patterned material layer over the substrate, wherein the patterned material layer having a plurality of trenches expose a portion of the charge trapping structure;
   forming a plurality of conductive spacers on the sidewalls of the trenches of the patterned material layer respectively, wherein a portion of the charge trapping structure at the bottom of the trenches is exposed;
   forming an insulating layer over the substrate to fill up the trenches of the patterned material layer; and
   performing a planarization process to remove a portion of the insulating layer until a top surface of the patterned material layer and a top surface of each of the conductive spacers are exposed.

2. The method of claim 1, wherein the width of the conductive spacer is smaller than 200 angstroms.

3. The method of claim 1, wherein the pitch of the conductive spacer is smaller than 500 angstroms.

4. The method of claim 1, wherein the thickness of the patterned material layer is about 800~1000 angstroms.

5. The method of claim 1, wherein the step of forming the conductive spacer further comprises:
   forming a conductive material layer over the substrate, wherein the conductive material layer is conformal to the trenches; and
   removing a portion of the conductive material layer until a top surface of the patterned material layer and a portion of the charge trapping structure at bottom of the trenches are exposed.

6. The method of claim 1, wherein the charge trapping structure comprises a bottom material layer, a carrier storage layer and an upper material layer.

7. The method of claim 6, wherein the bottom material layer comprises a single-layered material layer made of low-k (low-dielectric constant) material.

8. The method of claim 6, wherein the bottom material layer comprises a single-layered material layer made of high-k (high-dielectric constant) material.

9. The method of claim 6, wherein the bottom material layer comprises a multi-layered material layer.

10. The method of claim 9, wherein the multi-layered material layer can be selected from a group consisting of a low-k/high-k layer and a low-k/high-k/low-k layer.

11. The method of claim 6, wherein the material of the carrier storage layer comprises silicon nitride and silicon-rich nitride.

12. The method of claim 6, wherein the upper material layer comprises a single-layered material layer made of low-k (low-dielectric constant) material or high-k (high-dielectric constant) material.

13. The method of claim 6, wherein the upper material layer comprises a multi-layered material layer.

14. The method of claim 13, wherein the multi-layered material layer can be selected from a group consisting of a low-k/high-k layer and a low-k/high-k/low-k layer and any combination of low k and high k layer.

15. The method of claim 1, wherein the material of the conductive spacers is selected from a group consisting of polysilicon, doped polysilicon, tungsten, aluminum, titanium, titanium nitride, tantalum nitride, copper, iridium oxide, platinum, nickel and the combination thereof.

16. The method of claim 1, wherein, after the planarization process is performed, the conductive spacers are transformed to be a plurality word lines.

17. The method of claim 1, wherein the conductive spacers are parallel to each other and across a plurality of bit lines within the substrate.

18. A method for forming a memory array, comprising:
   providing a substrate having a charge trapping structure formed thereon;
   forming a plurality of strip-type patterns over the substrate, wherein the strip-type patterns are parallel to each other and the strip-type patterns are separated from each other by a plurality of gaps respectively;
   forming a conductive spacers on each sidewall of the patterns respectively, wherein a portion of the charge trapping structure between the strip-type patterns is exposed;
   forming an insulating layer over the substrate to fill up the gaps between the strip-type patterns; and
   performing a planarization process to remove a portion of the insulating layer until a top surface of the patterns and a top surface of each of the conductive spacers are exposed.

19. The method of claim 18, wherein a distance between the strip-type patterns is larger than a width of each of the strip-type patterns.

20. The method of claim 18, wherein the width of the conductive spacer is smaller than 200 angstroms.

21. The method of claim 18, wherein the pitch of the conductive spacer is smaller than 500 angstroms.

22. The method of claim 18, wherein the height of each of the patterns is about 800~1000 angstroms.

23. The method of claim 18, wherein the step of forming the conductive spacer further comprises:
   forming a conductive material layer over the substrate, wherein the conductive material layer is conformal to the patterns; and
   removing a portion of the conductive material layer until a top surface of each of the patterns and a portion of the charge trapping structure between the patterns are exposed.

24. The method of claim 18, wherein the charge trapping structure comprises, from a bottom to a top of the charge trapping structure, a bottom material layer, a carrier storage layer and an upper material layer.

25. The method of claim 24, wherein the bottom material layer comprises a single-layered material layer made of low-k (low-dielectric constant) material.

26. The method of claim 24, wherein the bottom material layer comprises a single-layered material layer made of high-k (high-dielectric constant) material.

27. The method of claim 24, wherein the bottom material layer comprises a multi-layered material layer.

28. The method of claim 27, wherein the multi-layered material layer can be selected from a group consisting of a low-k/high-k layer and a low-k/high-k/low-k layer.

29. The method of claim 24, wherein the material of the carrier storage layer comprises silicon nitride and silicon-rich nitride.

30. The method of claim 24, wherein the upper material layer comprises a single-layered material layer made of low-k (low-dielectric constant) material or high-k (high-dielectric constant) material.

31. The method of claim 24, wherein the upper material layer comprises a multi-layered material layer.

32. The method of claim 31, wherein the multi-layered material layer can be selected from a group consisting of a low-k/high-k layer and a low-k/high-k/low-k layer and any combination of low k and high k layer.

33. The method of claim 24, wherein the material of the conductive spacers is selected from a group consisting of polysilicon, doped polysilicon, tungsten, aluminum, titanium, titanium nitride, tantalum nitride, copper, iridium oxide, platinum, nickel and the combination thereof.

34. The method of claim 18, wherein the conductive spacers are parallel to each other.

35. The method of claim 18, wherein, after the planarization process is performed, the conductive spacers are transformed to be a plurality word lines.

* * * * *